US007034639B2

(12) United States Patent
Takamine et al.

(10) Patent No.: US 7,034,639 B2
(45) Date of Patent: Apr. 25, 2006

(54) LONGITUDINALLY COUPLED RESONATOR TYPE SURFACE ACOUSTIC WAVE FILTER AND COMMUNICATION APPARATUS INCORPORATING THE SAME

(75) Inventors: Yuichi Takamine, Kanazawa (JP); Yoichi Sawada, Ishikawa-ken (JP); Minefumi Ouchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 92 days.

(21) Appl. No.: 10/832,870

(22) Filed: Apr. 27, 2004

(65) Prior Publication Data

US 2004/0201436 A1    Oct. 14, 2004

Related U.S. Application Data

(63) Continuation of application No. 09/886,083, filed on Jun. 21, 2001, now Pat. No. 6,781,478.

(30) Foreign Application Priority Data

Jun. 26, 2000  (JP) .............................. 2000-191561
Apr. 19, 2001  (JP) .............................. 2001-121687

(51) Int. Cl.
  *H03H 9/64*   (2006.01)
  *H03H 9/72*   (2006.01)
(52) U.S. Cl. ..................... 333/195; 333/133
(58) Field of Classification Search ................. 333/195
   See application file for complete search history.

(56) References Cited

U.S. PATENT DOCUMENTS

| 5,568,002 A | 10/1996 | Kawakatsu et al. ...... 310/313 B |
| 5,790,000 A | 8/1998 | Dai et al. .................... 333/193 |
| 5,835,990 A | 11/1998 | Saw et al. .............. 310/313 D |
| 5,874,868 A | 2/1999 | Shimoe ...................... 333/193 |
| 5,963,114 A | 10/1999 | Ueda et al. ................. 333/195 |
| 6,081,172 A | 6/2000 | Strauss et al. .............. 333/193 |
| 6,111,481 A | 8/2000 | Ueda et al. ................. 333/194 |
| 6,255,915 B1 | 7/2001 | Edmonson ................... 333/193 |
| 6,268,782 B1 | 7/2001 | Hartmann et al. .......... 333/193 |
| 6,420,946 B1 | 7/2002 | Bauer et al. ................. 333/193 |

FOREIGN PATENT DOCUMENTS

| DE | 197 24 258 | 12/1998 |
| DE | 199 38 748 A1 | 3/2001 |
| JP | 55-5573 | 1/1980 |
| JP | 10-290141 | 10/1988 |
| JP | 5-267989 | 10/1993 |
| JP | 6-204781 | 7/1994 |
| JP | 9-205342 | 8/1997 |
| JP | 9-321574 | 12/1997 |
| JP | 9-326669 | 12/1997 |
| JP | 11-97966 | 4/1999 |

(Continued)

*Primary Examiner*—Barbara Summons
(74) *Attorney, Agent, or Firm*—Keating & Bennett, LLP

(57) ABSTRACT

A longitudinally coupled resonator type surface acoustic wave filter having a balance-unbalance conversion function achieves improved amplitude balance and phase balance. The surface acoustic wave filter includes first, second and third IDTs. The second IDT is positioned in the center of the three IDTs and has an even number of electrode fingers. The polarity of the electrode finger of the first IDT adjacent to the second IDT is opposite to the polarity of the electrode finger of the third IDT adjacent to the second IDT.

21 Claims, 14 Drawing Sheets

FOREIGN PATENT DOCUMENTS

| | | |
|---|---|---|
| JP | 11-317642 | 11/1999 |
| JP | 2000-151337 | 5/2000 |
| JP | 2001-313540 | 11/2001 |
| JP | 2001-345666 | 12/2001 |
| JP | 2003-501917 | 2/2003 |
| WO | WO 98/128809 | 3/1998 |
| WO | WO 00/254423 | 5/2000 |
| WO | WO 01/13514 A1 | 2/2001 |

LONGITUDINALLY COUPLED RESONATOR TYPE SURFACE ACOUSTIC WAVE FILTER AND COMMUNICATION APPARATUS INCORPORATING THE SAME

This application is a Continuation of U.S. patent application Ser. No. 09/886,083 filed Jun. 21, 2001, now U.S. Pat. No. 6,781,478.

BACKGROUND OF THE INVENTION

1. Field of the Invention

The present invention relates to longitudinally coupled resonator type surface acoustic wave filters. More particularly, the present invention relates to longitudinally coupled resonator type surface acoustic wave filters having balance-unbalance conversion functions.

2. Description of the Related Art

Recently, the sizes and weights of mobile phones have been greatly reduced. With such a trend, the numbers and sizes of components used in mobile phones have also been reduced while making such components more and more multifunctional.

With the above-described considerations, various kinds of mobile phones have been provided. In these mobile phones, surface acoustic wave filters are incorporated in the RF stages of the phones to have balance-unbalance conversion functions, or so-called balun functions.

FIG. 22 is a schematic plan view for illustrating the electrode structure of a conventional surface acoustic wave filter having a balance-unbalance conversion function.

In this filter, first, second and third IDTs 101, 102 and 103 are arranged in a surface acoustic wave propagating direction. Reflectors 104 and 105 are arranged on each side of the surface acoustic wave propagating direction in the region where the IDTs 101, 102 and 103 are arranged. When a wavelength determined by the electrode finger pitch of each of the IDTs 101, 102 and 103 is λI, both a distance between the centers of the mutually adjacent electrode fingers of the IDTs 101 and 102 and a distance between the centers of the mutually adjacent electrode fingers of the IDTs 102 and 103 are 0.75 λI. The widths of the electrode fingers 109 and 110 of the ends of the IDT 102 are increased to reduce spaces between the IDTs. As a result, loss due to the irradiation of a bulk wave can be reduced. In FIG. 22, terminals 106 and 107 are balanced signal terminals, and a terminal 108 is an unbalanced signal terminal.

In such a surface acoustic wave filter having the balance-unbalance conversion function, regarding propagation characteristics in a pass band between the unbalanced signal terminal 108 and the balanced signal terminal 106 and between the unbalanced signal terminal 108 and the balanced terminal 107, amplitude characteristics need to be equal and propagating signals need to be 180° out of phase with respect to each other. The condition in which the amplitude characteristics are equal is referred to as amplitude balance and the degree at which the propagating signals are 180° out of phase with respect to each other is referred to as phase balance.

The amplitude balance and the phase balance are defined as follows when the surface acoustic wave filter having the balance-unbalance conversion function is regarded as a device having three ports, such as the unbalanced input terminal as port 1 and the balanced output terminals as ports 2 and 3.

Amplitude balance=|A|.
A=|20 log S21|–|20 log S31|.
Phase balance=|B–180|.
B=|∠S21–∠S31|.

In this definition, S21 denotes a transfer factor from the port 1 to the port 2 and S31 denotes a transfer factor from the port 1 to the port 3.

Ideally, in the pass band of the filter, the amplitude balance needs to be 0 dB and the phase balance needs to be 0°. However, with the use of the structure shown in FIG. 22, when intending to obtain a filter having a balance-unbalance conversion function, since the IDT 102 has an odd number of electrode fingers, the number of electrode fingers connected to the balanced signal terminal 106 increases by one more than the number of electrode fingers connected to the balanced signal terminal 107. As a result, there is a problem in that the degree of balance is deteriorated. The higher the central frequency of the filter is, the more noticeable the deterioration. Thus, like DCS filters and PCS filters, in a filter having a central frequency near 1.9 GHz, sufficient balance cannot be obtained.

SUMMARY OF THE INVENTION

In order to overcome the problems described above, preferred embodiments of the present invention provide a longitudinally coupled resonator type surface acoustic wave filter having a balance-unbalance conversion function, in which the amplitude balance and the phase balance are greatly improved. In addition, preferred embodiments of the present invention provide a communication apparatus including such a novel longitudinally coupled resonator type surface acoustic wave filter.

According to a preferred embodiment of the present invention, a longitudinally coupled resonator type surface acoustic wave filter having a balance-unbalance conversion function includes a piezoelectric substrate, first, second and third IDTs arranged on the piezoelectric substrate in a surface acoustic wave propagating direction, the second IDT being positioned between the first and third IDTs and having an even number of electrode fingers.

According to another preferred embodiment of the present invention, a longitudinally coupled resonator type surface acoustic wave filter having a balance-unbalance conversion function includes first-stage and second-stage longitudinally coupled resonator surface acoustic wave filters longitudinally coupled to each other, each of the first-stage and second-stage filters having a piezoelectric substrate and first, second and third IDTs arranged on the piezoelectric substrate in a surface acoustic wave propagating direction, an unbalanced signal terminal connected to one end of the second IDT of the first-stage longitudinally coupled resonator surface acoustic wave filter, a first balanced signal terminal connected to one end of the second IDT of the second-stage longitudinally coupled resonator surface acoustic wave filter, a second balanced signal terminal connected to the other end of the second IDT of the second-stage filter, a first signal line connecting one end of the first IDT of the first-stage longitudinally coupled resonator surface acoustic wave filter and one end of the first IDT of the second-stage longitudinally coupled resonator surface acoustic wave filter, and a second signal line connecting one end of the third IDT of the first-stage longitudinally coupled resonator surface acoustic wave filter and one end of the third IDT of the second-stage longitudinally coupled resonator surface acoustic wave filter. In this filter, an electric signal propagating through the first signal line is 180° out of phase with an electric signal propagating through the second signal line.

In the filter according to this preferred embodiment of the present invention, the second IDT of at least one of the first-stage filter and the second-stage filter may have an even number of electrode fingers.

According to a third preferred embodiment of the present invention, a communication apparatus including the longitudinally coupled resonator type surface acoustic wave filter according to the above-described preferred embodiment of the present invention.

The above and other elements, characteristics, features, and advantages of the present invention will be clear from the following detailed description of preferred embodiments of the present invention in conjunction with the accompanying drawings.

DETAILED DESCRIPTION OF PREFERRED EMBODIMENTS

With reference to the drawings, the present invention will be clarified by describing preferred embodiments of a longitudinally coupled resonator type surface acoustic wave filter according to the present invention.

Figure 1:
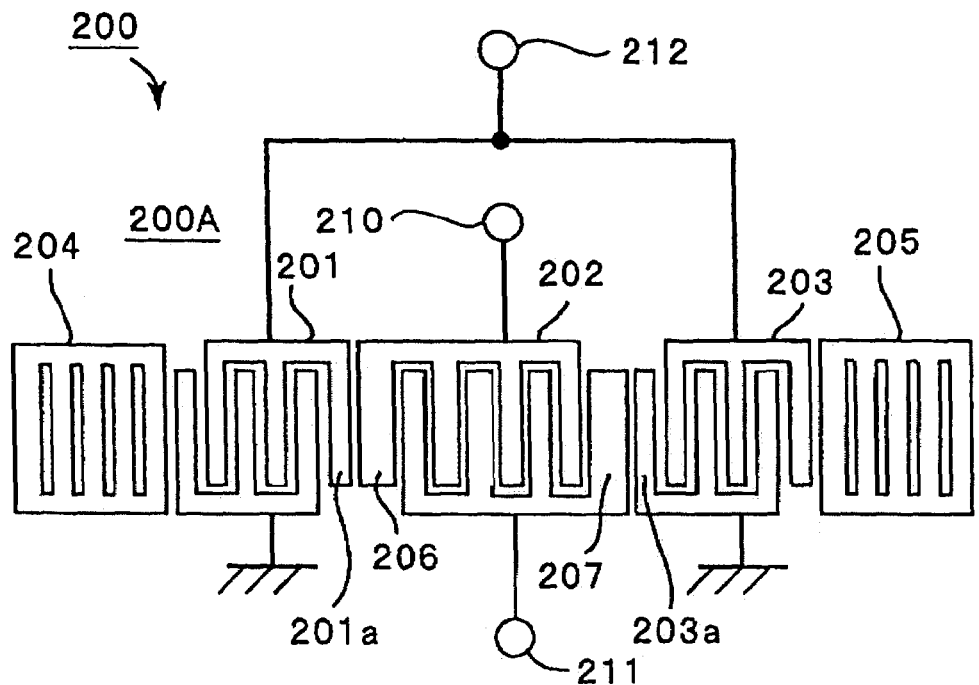
FIG. 1 shows a schematic plan view for illustrating a longitudinally coupled resonator type surface acoustic wave filter according to a first preferred embodiment of the present invention.

FIG. 1 shows a schematic plan view for illustrating the longitudinally coupled resonator type surface acoustic wave filter, preferably for use as a PCS reception filter, according to a first preferred embodiment of the present invention. In a longitudinally coupled resonator type surface acoustic wave filter 200, there is provided an electrode structure shown in FIG. 1 on a piezoelectric substrate 200A. A 40±5° Y-cut X-propagation LiTaO$_3$ substrate is preferably used as the piezoelectric substrate 200A.

On the piezoelectric substrate, first, second and third IDTs 201, 202 and 203 are arranged in a surface acoustic wave propagating direction. Reflectors 204 and 205 are arranged in the surface wave propagating direction on the right and left of the region where the IDTs 201, 202 and 203 are arranged. The IDTs 201, 202 and 203 and the reflectors 204 and 205 are preferably made of Al.

In other words, the longitudinally coupled resonator type surface acoustic wave filter 200 is a longitudinally coupled resonator type surface acoustic wave filter having three IDTs.

In FIG. 1, in order to simplify the illustration, the number of electrodes shown in the figure is less than the number of electrodes to be actually included in the device.

One end of each of the IDTs 201 and 203 is connected to an unbalanced signal terminal 212. One end of the IDT 202 is connected to a balanced signal terminal 210, and the other end thereof is connected to a balanced signal terminal 211.

The detailed design of an example of the present preferred embodiment of the longitudinally coupled resonator type surface acoustic wave filter 200 will be presented below.

Electrode finger cross width W=78.8λI.

The number of the electrode fingers of each of IDTs 201 and 203=24.

The number of the electrode fingers of IDT 202=40.

IDT wavelength λI=2.03 μm.

The wavelength λR of each of reflectors 204 and 205=2.05 μm.

The number of the electrode fingers of each of the reflectors 204 and 205=100.

IDT Gap=0.77 λI. In this case, the gap between the IDTs is preferably substantially equivalent to a distance between the centers of the mutually adjacent electrode fingers of the IDTs.

IDT-reflector gap=0.55 λR. The gap between an IDT and a reflector is preferably substantially equivalent to a distance between the centers of the mutually adjacent electrode fingers of the IDT and the reflector.

IDT Duty=0.60.

Reflector Duty=0.60.

Electrode-film thickness=0.08 λI.

In addition, as shown in FIG. 1, the widths of the electrode fingers 206 and 207 on each side of the IDT 202 are preferably broader than those of the remaining electrode fingers. With this arrangement, the space in the gap between the IDTs is reduced.

As the characteristics of the first preferred embodiment of the present invention, the total number of the electrode fingers of the IDT 202 arranged in the center is preferably an even number and an electrode finger 201a of the IDT 201 adjacent to the IDT 202 is arranged to define a signal electrode, whereas an electrode finger 203a of the IDT 203 adjacent to the IDT 202 is arranged to define a ground electrode. As shown here, of the electrode fingers of the right IDT 201 and the left IDT 203, the electrode fingers 201a and 203a adjacent to the central second IDT 202 have opposite polarities. The reason for this will be described below with reference to FIGS. 2 and 3.

Figure 2:
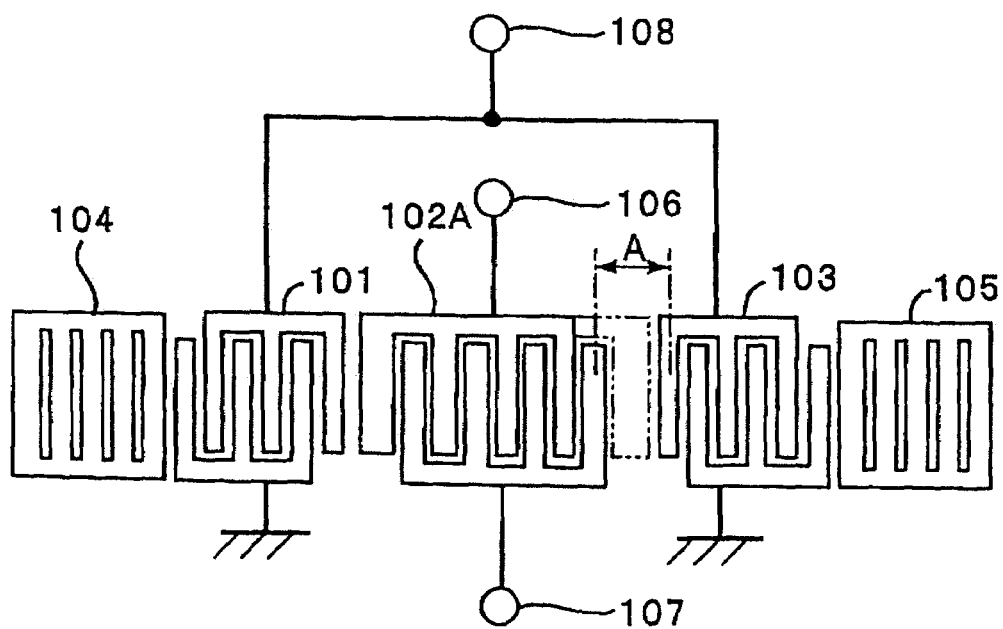
FIG. 2 shows a schematic plan view for illustrating the electrode structure of a longitudinally coupled resonator type surface acoustic wave filter presented as a prerequisite for the first preferred embodiment of the present invention.
Figure 22:
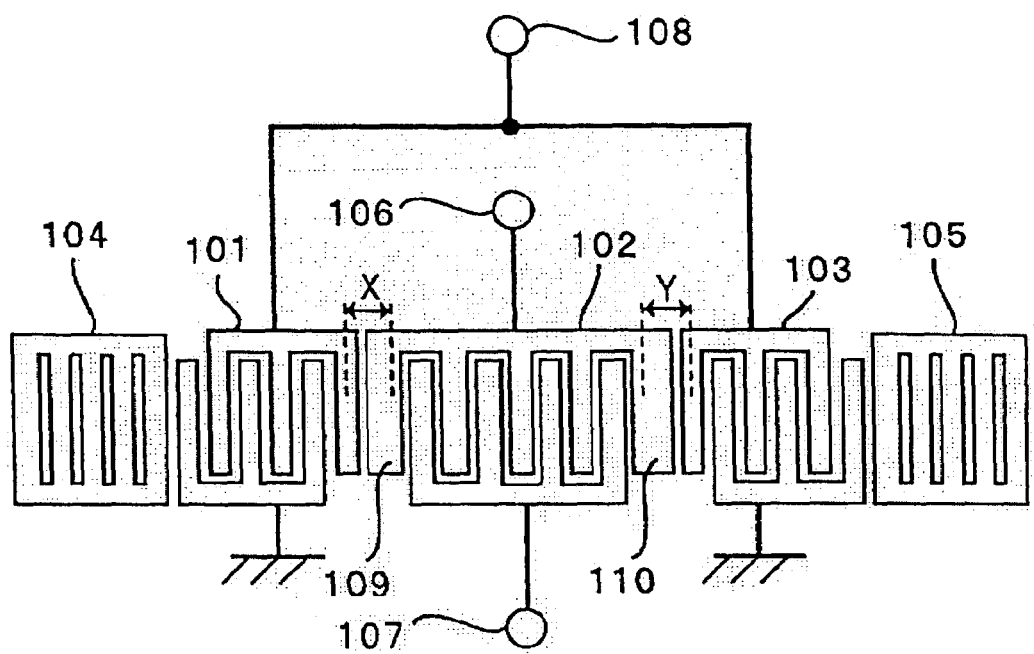
FIG. 22 shows a schematic plan view for illustrating the conventional longitudinally coupled resonator type surface acoustic wave filter.

In the conventional longitudinally coupled resonator type surface acoustic wave filter 100 shown in FIG. 22, when one of the electrode fingers of the central IDT 102 is removed, as shown in FIG. 2, the number of the electrode fingers of the central IDT 102A is an even number. On the other hand, since a distance A between the IDT 102A and the IDT 103 is increased by about 0.5 λI, loss due to the irradiation of a bulk wave is increased.

Figure 3:
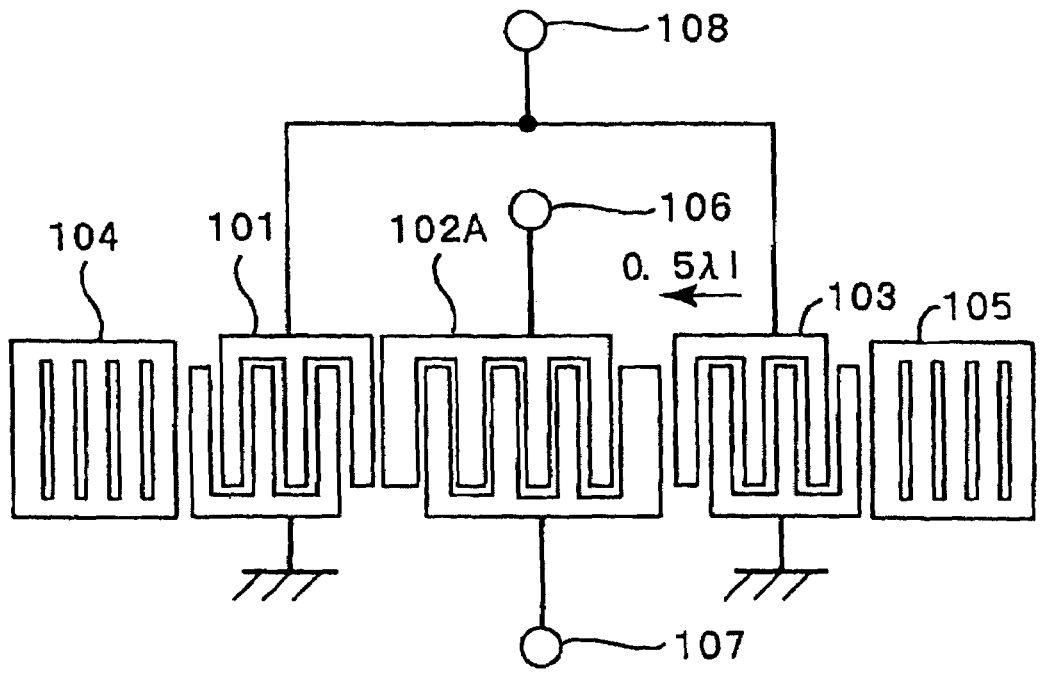
FIG. 3 shows a schematic plan view of a longitudinally coupled resonator type surface acoustic wave filter used as another prerequisite for the first preferred embodiment of the present invention.

Thus, as shown in FIG. 3, there can be considered a structure in which the third IDT 103 is shifted by about 0.5 λI toward the IDT 102A. However, in the structure shown in FIG. 3, the IDT 101 and the IDT 103 are 180° out of phase with each other.

Therefore, in this preferred embodiment of the present invention, as shown in FIG. 1, by having the IDT 201 reversed from the IDT 203, the IDT 201 and the IDT 203 are in phase with each other.

Figure 4:
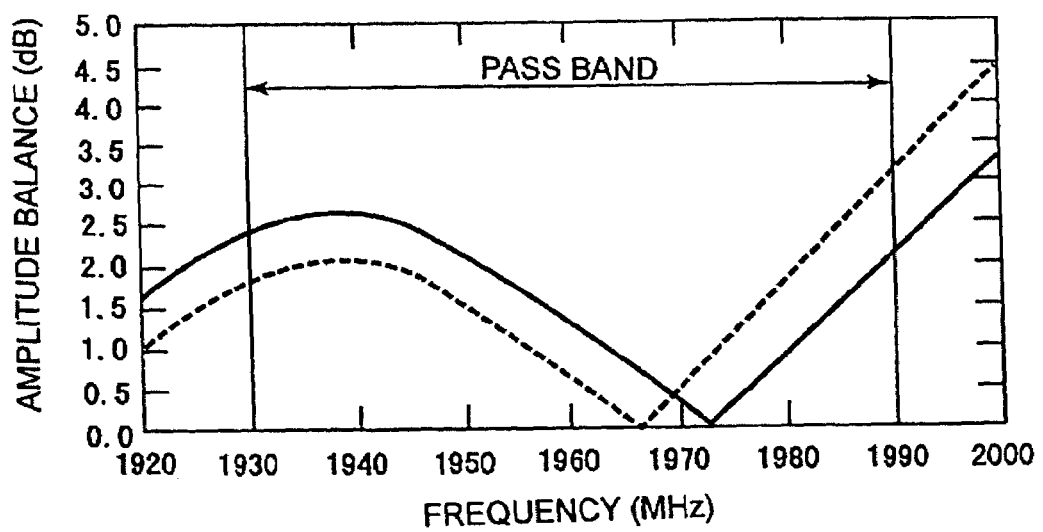
FIG. 4 shows a graph illustrating the relationship between amplitude balance and frequency characteristics of each of the first preferred embodiment of the present invention and a conventional device.
Figure 5:
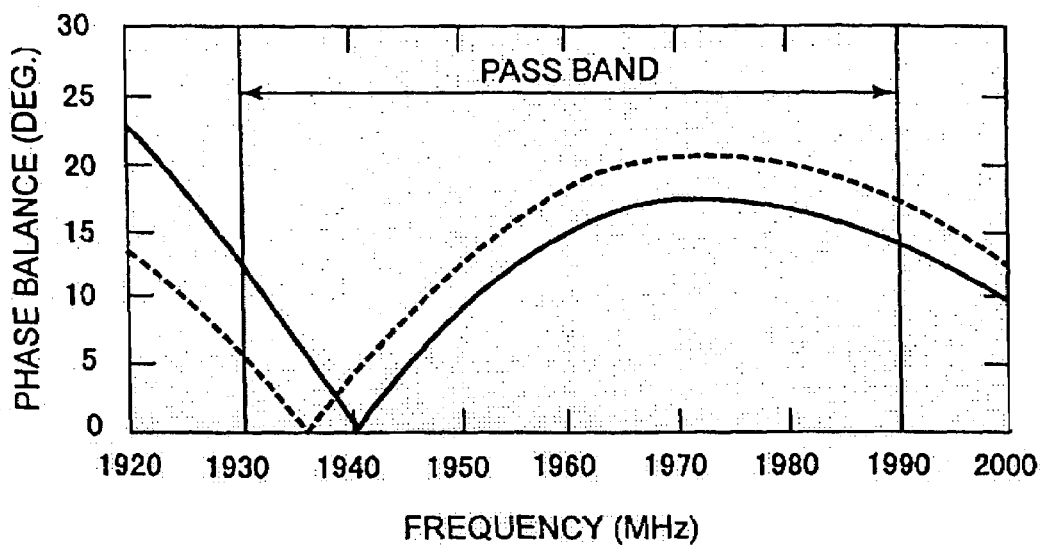
FIG. 5 shows a graph illustrating the relationship between phase balance and frequency characteristics of each of the first preferred embodiment of the present invention and the conventional device.

FIG. 4 shows a graph illustrating the relationship between amplitude balance and frequencies in the longitudinally coupled resonator type surface acoustic wave filter according to the first preferred embodiment of the present invention. FIG. 5 shows a graph illustrating the relationship between phase balance and frequencies in the same filter. In FIGS. 4 and 5, solid lines show the results of the first preferred embodiment of the present invention. In addition, for comparison, in FIGS. 4 and 5, broken lines show the characteristics of the conventional filter shown in FIG. 22.

In this case, the conventional filter has the same detailed design as that of the first preferred embodiment, except that one of the electrode fingers of the central IDT in the conventional filter is removed.

A pass-band frequency range used in the PCS reception filter is between about 1930 MHz to about 1990 MHz. As seen in FIG. 4, in the frequency band range, the maximum amplitude balance is 3.2 dB in the conventional filter, whereas it is about 2.7 dB in the first preferred embodiment of the present invention. That is, the amplitude balance is improved by about 0.5 dB in this preferred embodiment of the present invention. Moreover, as shown in FIG. 5, whereas the maximum phase balance in the conventional filter is 21°, the maximum phase balance in the first preferred embodiment of the present invention is about 17°. That is, obviously, the phase balance is improved by about 4° in this preferred embodiment of the present invention.

As mentioned above, in this preferred embodiment of the present invention, the total number of the electrode fingers of the central second IDT 202 is an even number and the polarity of the electrode finger of the first IDT 201 adjacent to the central second IDT 202 is reversed from the polarity of the electrode finger of the third IDT 203 adjacent to the IDT 202. Thus, as compared with the conventional filter, obviously, the first preferred embodiment of the present invention provides a longitudinally coupled resonator type surface acoustic wave filter having a balance-unbalance conversion function, in which the amplitude balance and the phase balance are both greatly improved.

This preferred embodiment preferably uses a 40±5° Y-cut X-propagation LiTaO$_3$ substrate. However, the substrate used in the present invention is not restricted to the LiTaO$_3$ substrate. Any other piezoelectric substrate may be used such as a 64 to 72° Y-cut X-propagation LiNbO$_3$ substrate or a 41° Y-cut X-propagation LiNbO$_3$ substrate, for example. Other suitable substrates may also be used.

Figure 6:
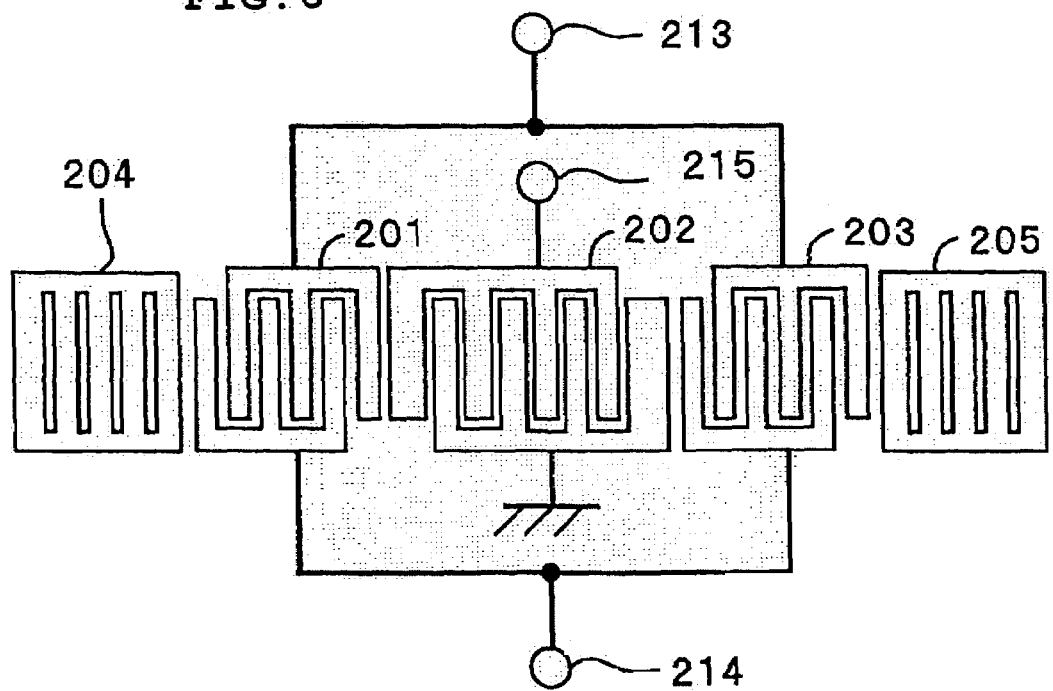
FIG. 6 shows a schematic plan view for illustrating a longitudinally coupled resonator type surface acoustic wave filter as a first modified example of the first preferred embodiment of the present invention.

In addition, in the first preferred embodiment of the present invention, a balanced signal is obtained from the central second IDT. However, as shown in FIG. 6, the balanced signal may be obtained from each of the first IDT 201 and the third IDT 203 on each side of the central IDT 202. In FIG. 6, terminals 213 and 214 are balanced signal terminals connected to the first and third IDTs 201 and 203, respectively, and a terminal 215 is an unbalanced signal terminal connected to the central second IDT 202.

Figure 7:
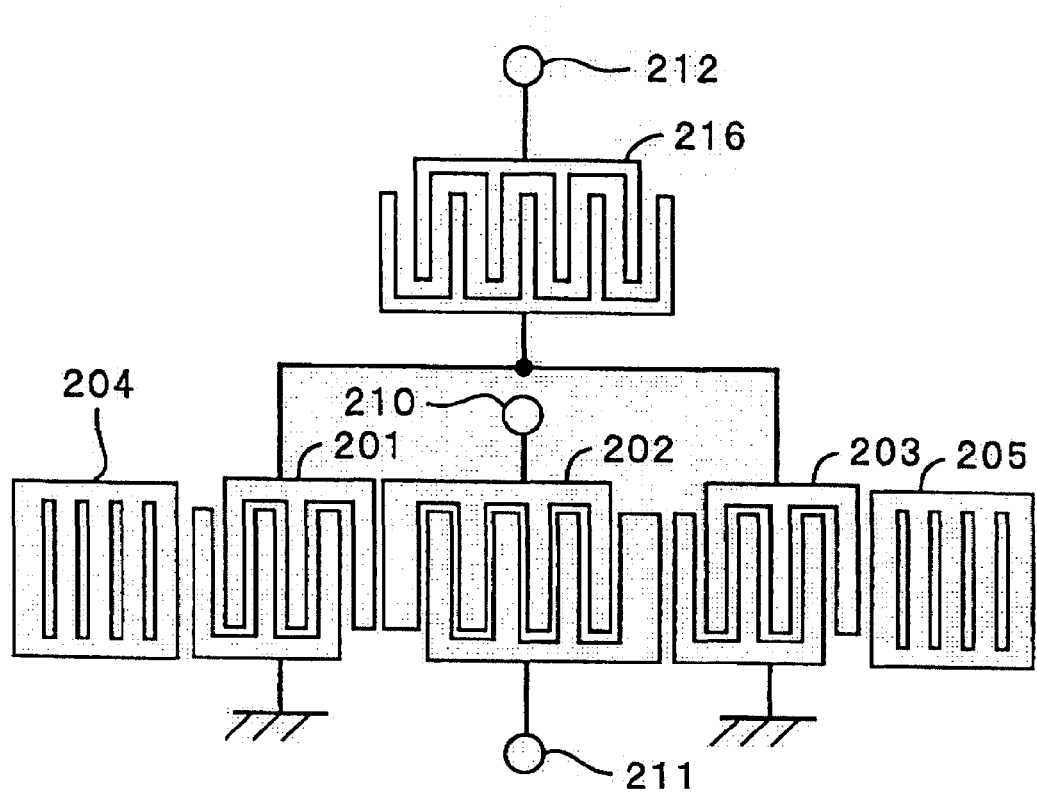
FIG. 7 shows a schematic plan view for illustrating a longitudinally coupled resonator type surface acoustic wave filter as a second modified example of the first preferred embodiment of the present invention.

FIG. 7 shows a schematic plan view for illustrating the electrode structure of another modified example of the first preferred embodiment of the present invention. As shown in FIG. 7, a surface acoustic wave resonator 216 may be connected between the first and third IDTs 201 and 203 and a terminal 212.

Figure 8:
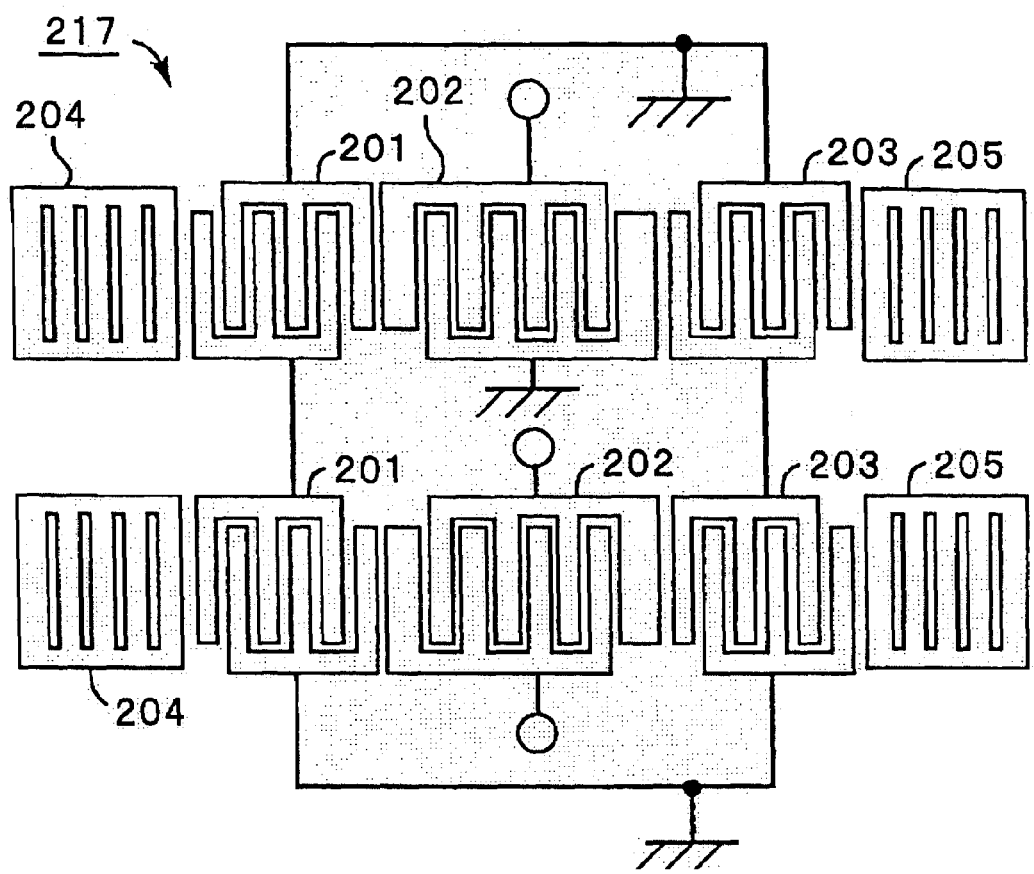
FIG. 8 shows a schematic plan view for illustrating a longitudinally coupled resonator type surface acoustic wave filter as a third modified example of the first preferred embodiment of the present invention.

FIG. 8 shows a schematic plan view for illustrating the electrode structure of another modified example of the first preferred embodiment of the present invention. In a longitudinally coupled resonator type surface acoustic wave filter 217 shown in FIG. 8, the longitudinally coupled resonator type surface acoustic wave filters 200 according to the first preferred embodiment are longitudinally connected in a two-stage structure.

Figure 9:
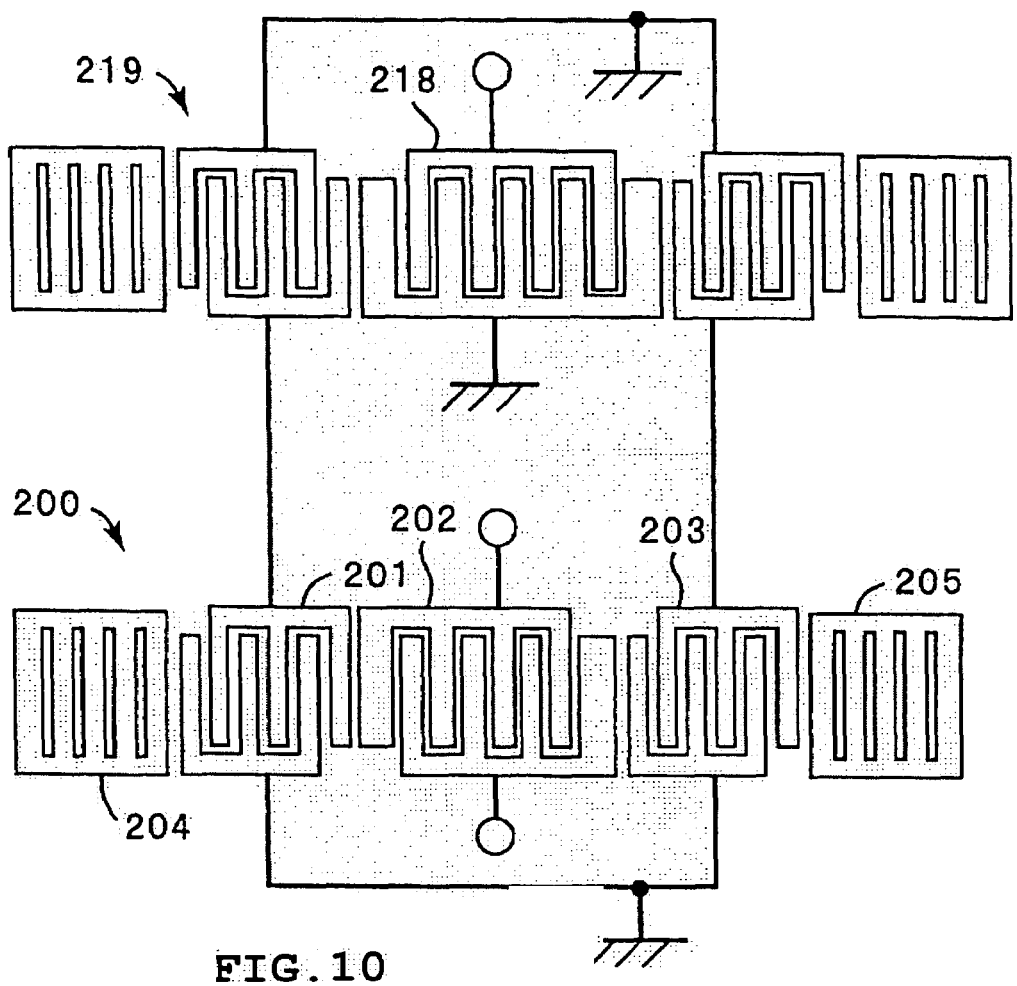
FIG. 9 shows a schematic plan view for illustrating a longitudinally coupled resonator type surface acoustic wave filter as a fourth modified example of the first preferred embodiment of the present invention.

In addition, FIG. 9 shows a schematic plan view for illustrating a longitudinally coupled resonator type surface acoustic wave filter as another modified example of the first preferred embodiment of the present invention. In FIG. 9, the longitudinally coupled resonator type surface acoustic wave filter 200 of the first preferred embodiment is longitudinally connected to a 3-IDT-type longitudinally coupled resonator type surface acoustic wave filter 219 including the central IDT 218 having an odd number of electrode fingers. In other words, in the multi-stage longitudinally coupled resonator type surface acoustic wave filters, even when at least only one-stage filter is defined by the longitudinally coupled resonator type surface acoustic wave filter 200 of the first preferred embodiment, as in the first preferred embodiment, greatly improved amplitude and phase balances are achieved.

Figure 10:
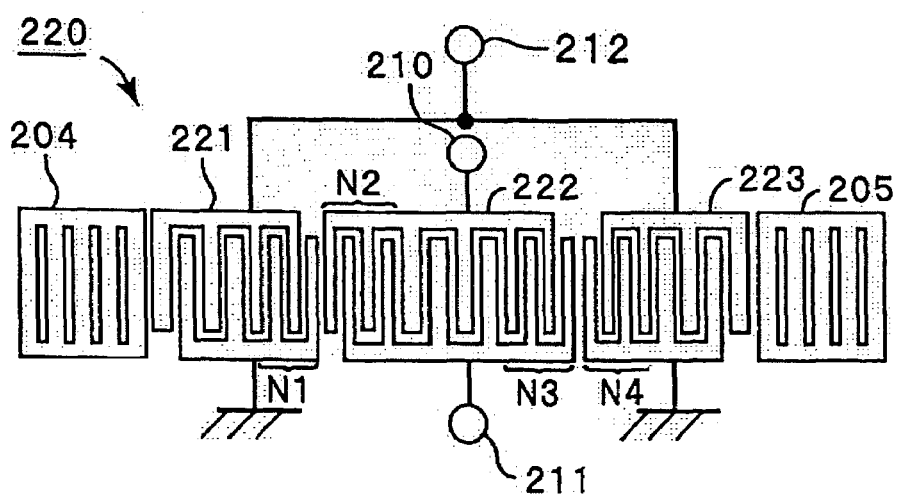
FIG. 10 shows a schematic plan view for illustrating a longitudinally coupled resonator type surface acoustic wave filter as a fifth modified example of the first preferred embodiment of the present invention.

FIG. 10 shows a schematic plan view for illustrating the electrode structure of another modified example of the longitudinally coupled resonator type surface acoustic wave filter of the first preferred embodiment. In a longitudinally coupled resonator type surface acoustic wave filter 220 shown in FIG. 10, narrow pitch electrode finger sections N1 to N4 are disposed in first, second and third IDTs 221, 222 and 223. Specifically, in the IDT 221, the narrow pitch electrode finger section N1, is arranged such that the electrode finger pitches of some portions from the end portion of the IDT 222 are narrower than the electrode finger pitches of the remaining portions of the IDT 221. Similarly, on each end portion of the IDT 222, the narrow pitch electrode finger sections N2 and N3 are provided. In addition, in the IDT 223, on the side adjacent to the IDT 222, the narrow pitch electrode finger section N4 is provided. As shown here, in the regions where the IDTs are adjacent to each other, even when disposing the narrow pitch electrode finger sections having relatively narrow electrode finger pitches, by arranging the remaining portions like the first preferred embodiment, greatly improved amplitude and phase balances are achieved.

Figure 11:
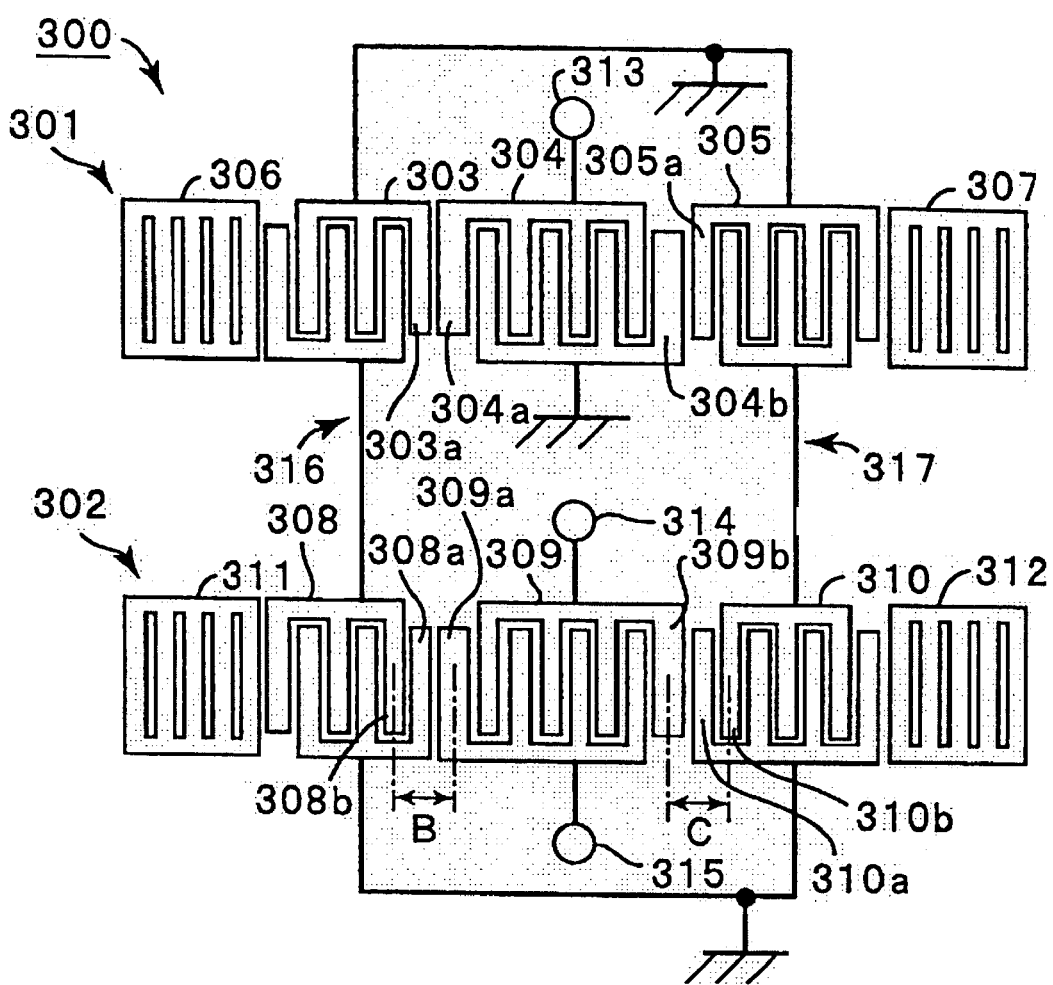
FIG. 11 shows a schematic plan view for illustrating a longitudinally coupled resonator type surface acoustic wave filter according to a second preferred embodiment of the present invention.

FIG. 11 shows a schematic plan view for illustrating the electrode structure of a longitudinally coupled resonator type surface acoustic wave filter according to a second preferred embodiment of the present invention.

The second preferred embodiment of the present invention relates to an AMPS reception filter.

Similar to the first preferred embodiment, the electrode structure shown in FIG. 11 is preferably formed on a 40±5° Y-cut X-propagation LiTaO$_3$ substrate to constitute a longitudinally coupled resonator type surface acoustic wave filter 300 of the second preferred embodiment of the present invention.

In the longitudinally coupled resonator type surface acoustic wave filter 300, a first longitudinally coupled resonator type surface acoustic wave filter 301 and a second longitudinally coupled resonator type surface acoustic wave filter 302 are longitudinally connected to each other. The first and second longitudinally coupled resonator type surface acoustic wave filters 301 and 302 preferably have the same structure.

Similar to the first preferred embodiment, the first-stage longitudinally coupled resonator type surface acoustic wave filter 301 includes first, second and third IDTs 303, 304 and 305 arranged in a surface acoustic wave propagating direction and reflectors 306 and 307, and the second-stage longitudinally coupled resonator type surface acoustic wave filter 302 includes first, second and third IDTs 308, 309 and 310 in the surface acoustic wave propagating direction and reflectors 311 and 312. The reflectors 306, 307, 311, and 312 are disposed on the right and left sides of the regions where the IDTs of the filters 301 and 302 are arranged. One end of each of the first and third IDTs 303 and 305 of the first longitudinally coupled resonator type surface acoustic wave filter 301 is connected to one end of each of the first and third IDTs 308 and 310 of the second longitudinally coupled resonator type surface acoustic wave filter 302 via first and second signal lines 316 and 317. One end of the IDT 304 is connected to a terminal 313. One end of the IDT 309 is connected to a terminal 314 and the other end thereof is connected to a terminal 315. The remaining ends of the IDTs 303, 304 and 305 and 308, 309 and 310 are connected to ground potentials.

The terminals 314 and 315 are balanced signal terminals. The terminal 313 is an unbalanced signal terminal. The detailed design of an example of the filter 300 will be presented below.

Electrode finger cross width W=49.0 λI.

The number of the electrode fingers of first IDTs 303 and 308=24.

The number of the electrode fingers of second IDTs 304 and 309=34.

The number of the electrode fingers of third IDTs 305 and 310=25.

IDT wavelength λI=4.49 μm.

Reflector wavelength λR=4.64 μm.

The number of reflector electrode fingers=120.

IDT gap=0.79 λI.

IDT-reflector gap=0.47 λR.

IDT duty=0.73.

Reflector duty=0.55.

Electrode film thickness=0.08 λI.

In this preferred embodiment of the present invention, the widths of the electrode fingers 304a, 304b, 309a, and 309b on each end of the central second IDTs 304 and 309 are broadened to reduce spaces between the adjacent IDTs.

In this preferred embodiment, the number of the electrode fingers of each of the IDTs 304 and 309 is preferably an even number as in the case of the first preferred embodiment. In addition, the electrode fingers 303a and 305a of the IDTs 303 and 305 adjacent to the IDT 304 and the electrode fingers 308a and 310a of the IDTs 308 and 310 adjacent to the IDT 309 are arranged to define ground electrodes.

In the first longitudinally coupled resonator type surface acoustic wave filter 301, the IDTs 303 and 305 are 180° out of phase with the IDT 304. Thus, when the IDTs 303 and 305 are connected in parallel to make the single stage filter, it is impossible to obtain filter characteristics. However, simultaneously, in the second longitudinally coupled resonator type surface acoustic wave filter 302, the IDTs 308 and 310 are also 180° out of phase with the IDT 309. As a result, since surface waves propagating from the IDTs 308 and 310 to the IDT 309 are in phase with each other, filter characteristics can be obtained by connecting the first and second longitudinally coupled resonator type surface acoustic wave filters 301 and 302. In other words, an electric signal propagating through a first signal line 316 is 180° out of phase with an electric signal propagating through a second signal line 317.

Figure 13:
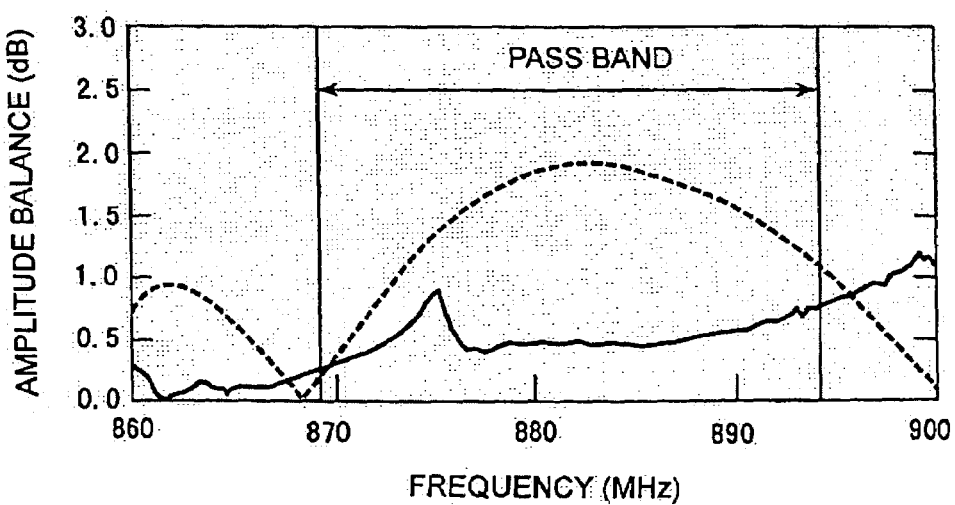
FIG. 13 shows a graph illustrating the relationship between amplitude balance and frequency characteristics of each of the second preferred embodiment and the conventional device.
Figure 14:
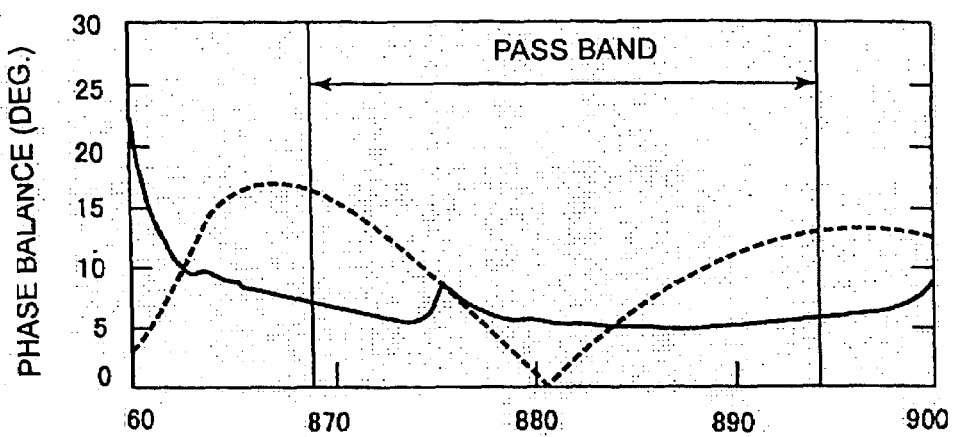
FIG. 14 shows a graph illustrating the relationship between phase balance and frequency characteristics of each of the second preferred embodiment and the conventional device.

FIG. 13 shows the relationship between amplitude balance and frequencies in the second preferred embodiment of the present invention. FIG. 14 shows the relationship between phase balance and frequencies. In FIGS. 13 and 14, solid lines indicate the results of the second preferred embodiment and broken lines indicate the results of a conventional device shown in FIG. 15, which is prepared for comparison.

Figure 15:
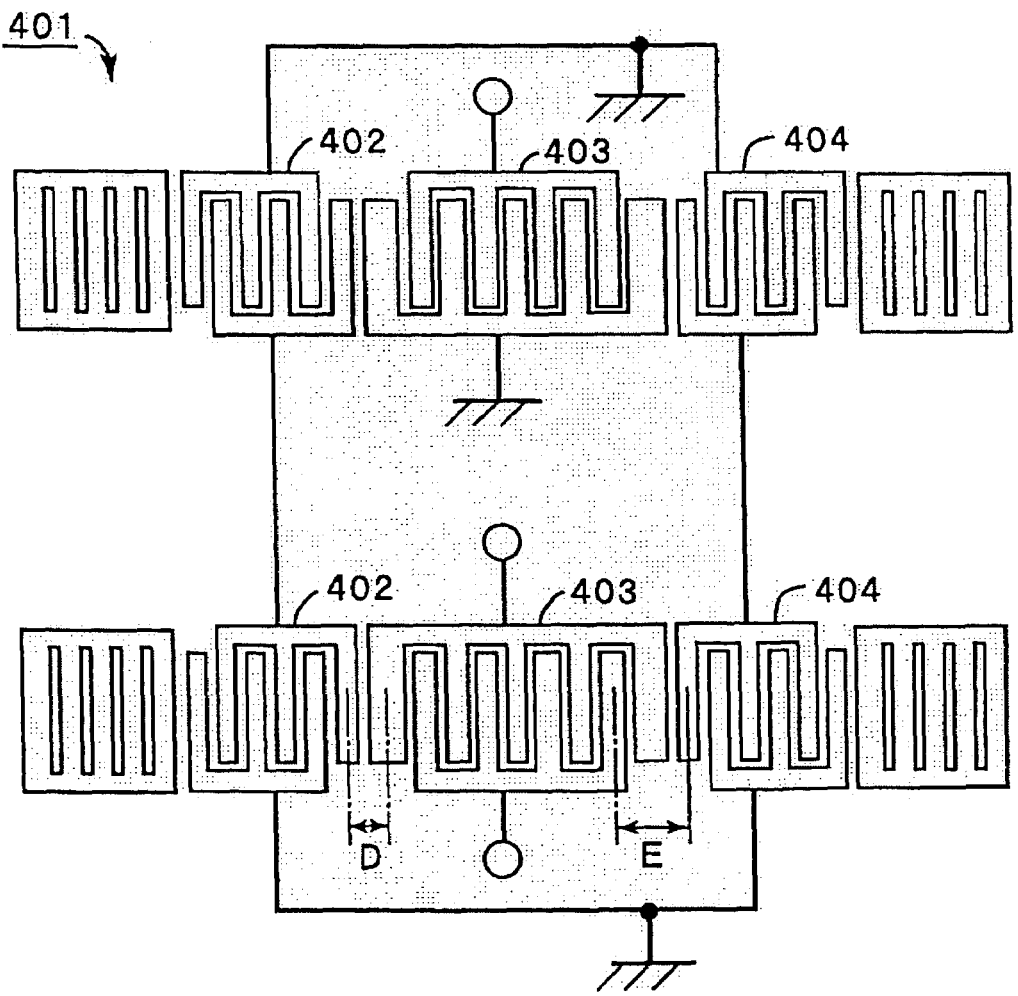
FIG. 15 shows a schematic plan view for illustrating the conventional filter prepared for a comparison with the second preferred embodiment of the present invention.

In a conventional longitudinally coupled resonator type surface acoustic wave filter 401 shown in FIG. 15, the numbers of the electrode fingers of first, second and third IDTs 402, 403 and 404 are preferably the same as those of the second preferred embodiment, except that the number of the electrode fingers of the first IDT is preferably 24, the number of the electrode fingers of the second IDT is preferably 35, and the number of the electrode fingers of the third IDT is preferably 24.

A pass-band frequency range in the AMPS reception filter is between approximately 860 MHz and approximately 894 MHz.

In the frequency range, the maximum amplitude balance is 1.9 dB in the conventional filter, whereas it is about 0.9 dB in the second preferred embodiment of the present invention. Thus, obviously, the amplitude balance is improved by about 1.0 dB in the second preferred embodiment.

In addition, whereas the maximum phase balance is 17° in the conventional filter, it is about 8° in the second preferred embodiment. The phase balance is improved by about 9° in the second preferred embodiment of the present invention.

As mentioned above, the reason that the amplitude and phase balances are improved is as follows. The second IDT has an even number of electrode fingers and the electric signal propagating through the first signal line 316 is 180° out of phase with the electric signal propagating through the second signal line 317. As a result, the electrode fingers of the first and third IDTs adjacent to the central second IDT can be both arranged to define ground electrodes, and a distance B (see FIG. 11) between the electrode finger 309a connected to the terminal 315 and the electrode signal finger 308b of the IDT 308 is substantially equal to a distance C (see FIG. 11) between the electrode finger 309b connected to the terminal 314 and the signal electrode finger 310b of the IDT 310. In contrast, in the conventional device shown in FIG. 15, distances D and E between electrode fingers, specified in the figure, between the adjacent IDTs in the second longitudinally coupled resonator type surface acoustic wave filter are differentiated by about 0.5 λI.

In the second preferred embodiment, the electrode fingers of the right first IDT and the left third IDT adjacent to the second IDT are ground electrodes. However, even when these electrode fingers constitute signal electrodes, the same advantages can be obtained.

As mentioned above, in the second preferred embodiment, the first and second longitudinally coupled resonator type surface acoustic wave filters 301 and 302 including the second IDTs having the even number of electrode fingers are longitudinally connected in the two-stage structure. Additionally, the electric signal propagating through the first signal line 316 is 180° out of phase with the electric signal propagating through the second signal line 317. With this arrangement, the polarity of the electrode fingers of the central second IDT can be the same as the polarities of the electrode fingers of the first and third IDTs adjacent to the second IDT. Both of the amplitude balance and the phase balance are also greatly improved.

Also, in the case where narrow pitch electrode fingers are used at the portion where two IDTs are adjacent to each other in the structure shown in FIG. 11, with respect to the second preferred embodiment, as shown in FIG. 10, the characteristics which indicates improved balance can be obtained.

Figure 12:
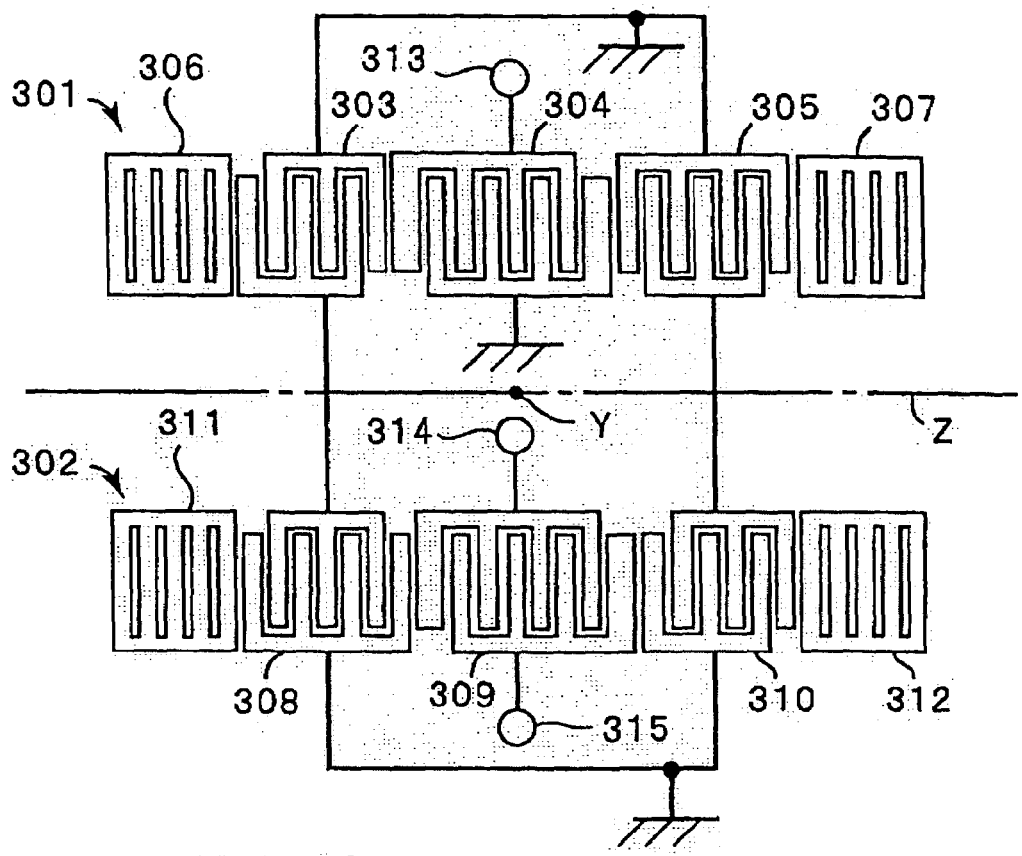
FIG. 12 shows a schematic plan view for illustrating a surface acoustic wave filter as a modified example of the second preferred embodiment of the present invention.

FIG. 12 shows a schematic plan view for illustrating a modified example of the second preferred embodiment of the present invention. This modified example is differentiated from the second preferred embodiment in that, in the arrangement shown in FIG. 11, the first and second surface acoustic wave filters 301 and 302 are symmetrical with respect to the axis Z in FIG. 12. However, in the modified example shown in FIG. 12, the surface acoustic wave filters 302 and 302 are symmetrical with respect to the point Y in the figure, that is, the center of the entire electrode structure including the surface acoustic wave filters 301 and 302.

Figure 16:
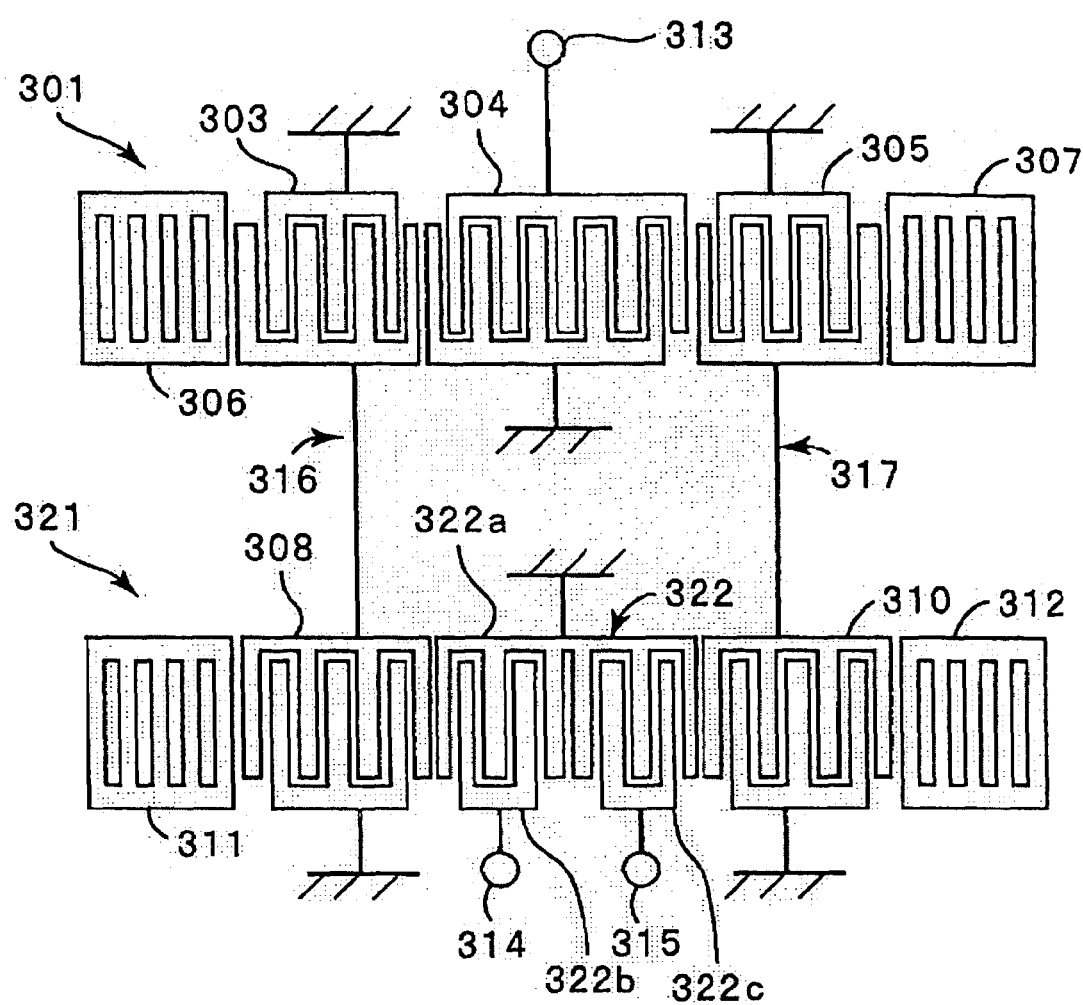
FIG. 16 shows a schematic plan view for illustrating another modified example of the second preferred embodiment of the present invention.

FIG. 16 shows a schematic plan view for illustrating another example of the second preferred embodiment of the present invention. In this modified example, first and second longitudinally coupled resonator type surface acoustic wave filters 301 and 321 are longitudinally connected to each other. Unlike the second preferred embodiment, in the second-stage longitudinally coupled resonator type surface acoustic wave filter 321, the central second IDT 322 is preferably split into two parts. The remaining parts are preferably substantially the same as those in the second preferred embodiment. Thus, the same reference numerals as those used in the second embodiment are given to the same parts in the modified example, and the explanation thereof will be omitted.

The second IDT 322 has an interdigital electrode 322a, and two interdigital electrodes 322b and 322c arranged such that the electrode fingers of the interdigital electrode 322a are interdigitated with the electrode fingers of the interdigital electrodes 322b and 322c. In other words, one of a pair of the interdigital electrodes defining the second IDT 322 is split into the two interdigital electrodes 322b and 322c, which are connected to balanced signal terminals 314 and 315. In this case, in the first-stage longitudinally coupled resonator type surface acoustic wave filter 301, the IDT 303 is 180° out of phase with the IDT 305. In the second-stage longitudinally coupled resonator type surface acoustic wave filter 321, the first IDT 308 is 180° out of phase with the second IDT 310. With this arrangement, an electric signal propagating through a signal line 316 is 180° out of phase with an electric signal propagating through a signal line 317. Thus, the polarities of the electrode fingers of the IDT 308 and the IDT 310 adjacent to the IDT 322 are the same. As a result, the amplitude and phase balances in this filter are greatly improved as with the second preferred embodiment of the present invention.

Figure 17:
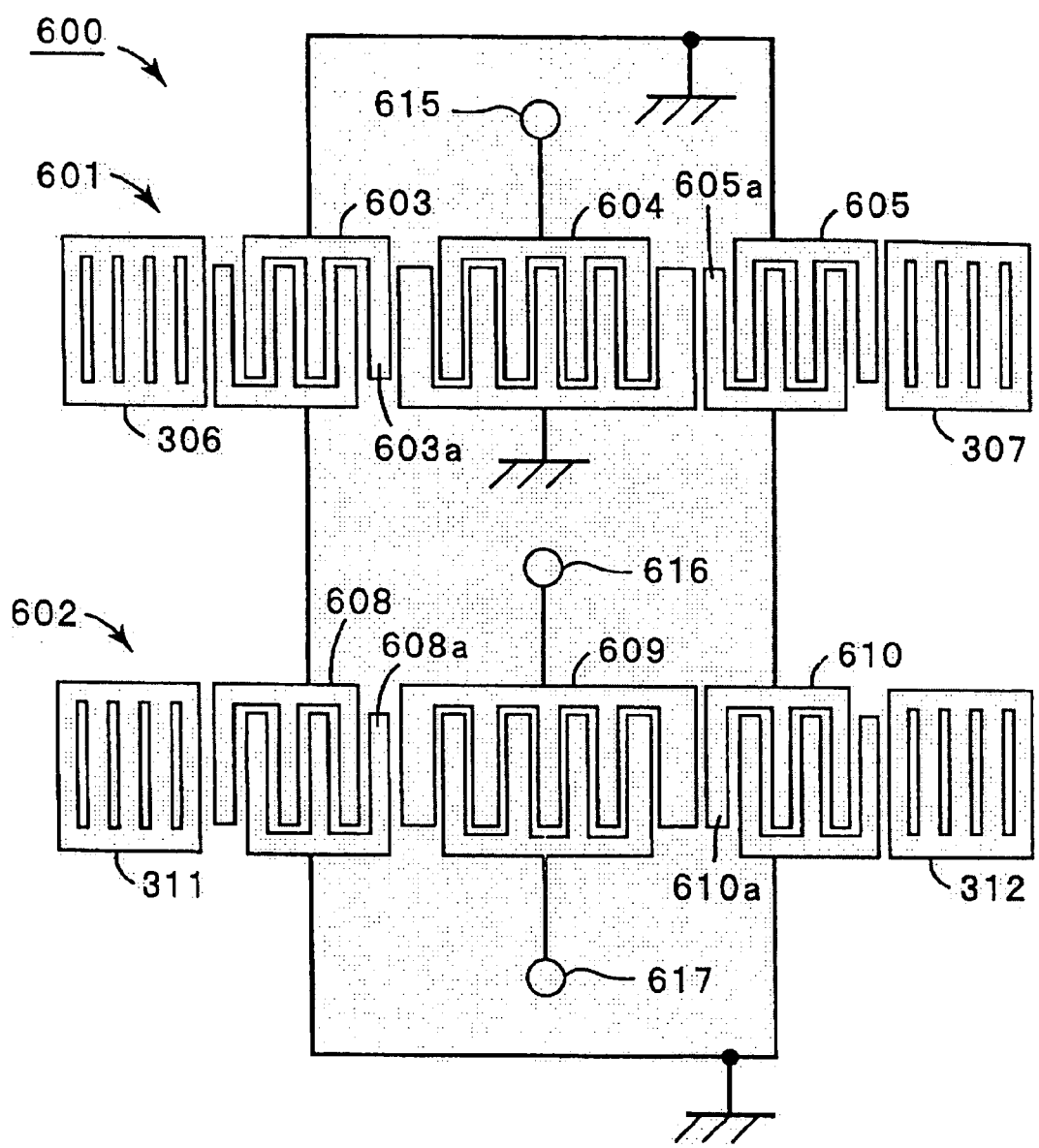
FIG. 17 shows a schematic plan view for illustrating a longitudinally coupled resonator type surface acoustic wave filter according to a third preferred embodiment of the present invention.

FIG. 17 shows a schematic plan view for illustrating the electrode structure of a longitudinally coupled resonator type surface acoustic wave filter according to a fourth preferred embodiment of the present invention.

A longitudinally coupled resonator type surface acoustic wave filter 600 of the fourth preferred embodiment preferably has the same structure as that of the second preferred embodiment, except for the following points.

In this preferred embodiment, in first-stage and second-stage longitudinally coupled resonator type surface acoustic wave filters 601 and 602, the numbers of the electrode fingers of first, second and third IDTs are determined, in which the number of the electrode fingers of each of the first IDTs 603 and 608 is preferably 24, the number of the electrode fingers of each of the second IDTs 604 and 609 is preferably 35, and the number of the electrode fingers of each of the third IDTs 605 and 610 is preferably 24.

In the fourth preferred embodiment, characteristically, the polarity of an electrode finger 603a of the first IDT 603 adjacent to the IDT 604 is opposite to the polarity of an electrode finger 605a of the third IDT 605 adjacent to the IDT 604. In addition, the polarity of an electrode finger 608a of the first IDT 608 adjacent to the IDT 609 is opposite to an electrode finger 610a of the third IDT 610 adjacent to the IDT 609.

When considering only the first-stage longitudinally coupled resonator type surface acoustic wave filter 601, each of the IDTs 603 and 605 is 180° out of phase with the IDT 604. Thus, it is impossible to obtain filter characteristics only by the single-stage filter structure in which the IDTs 603 and 605 are connected in parallel to each other. However, simultaneously, in the second-stage longitudinally coupled resonator type surface acoustic wave filter 602, each of the IDTs 608 and 610 is 180° out of phase with the IDT 609. As a result, since surface acoustic waves propagating from the IDTs 608 and 610 to the IDT 609 are in phase with each other, when the first-stage filter and the second-stage filter are connected, filter characteristics can be obtained.

A terminal 615 is an unbalanced signal terminal and terminals 616 and 617 are balanced signal terminals.

Figure 18:
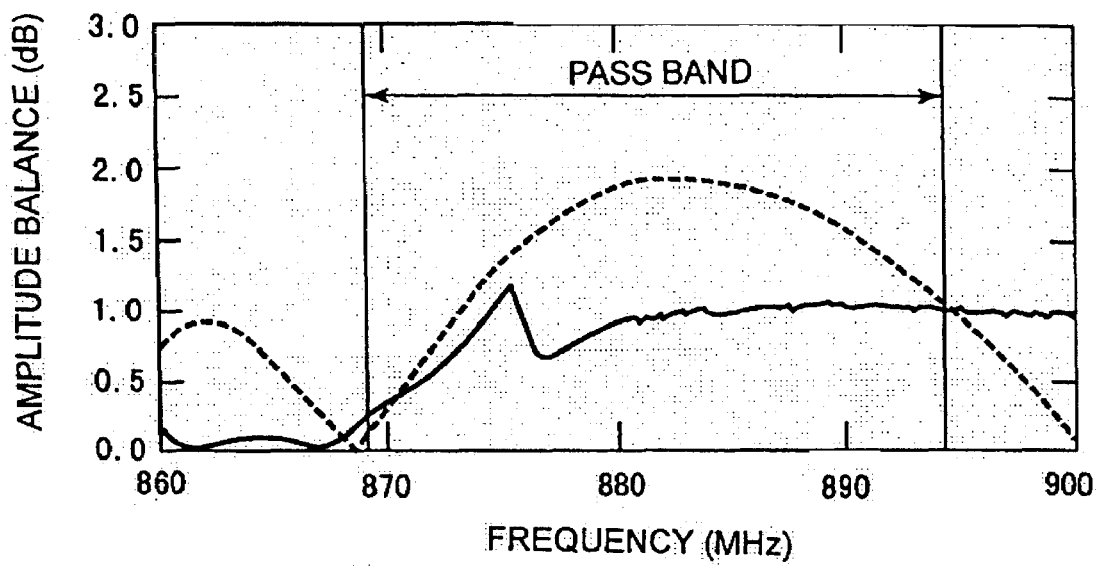
FIG. 18 shows a graph illustrating the relationship between amplitude balance and frequency characteristics of each of the third preferred embodiment of the present invention and the conventional device.
Figure 19:
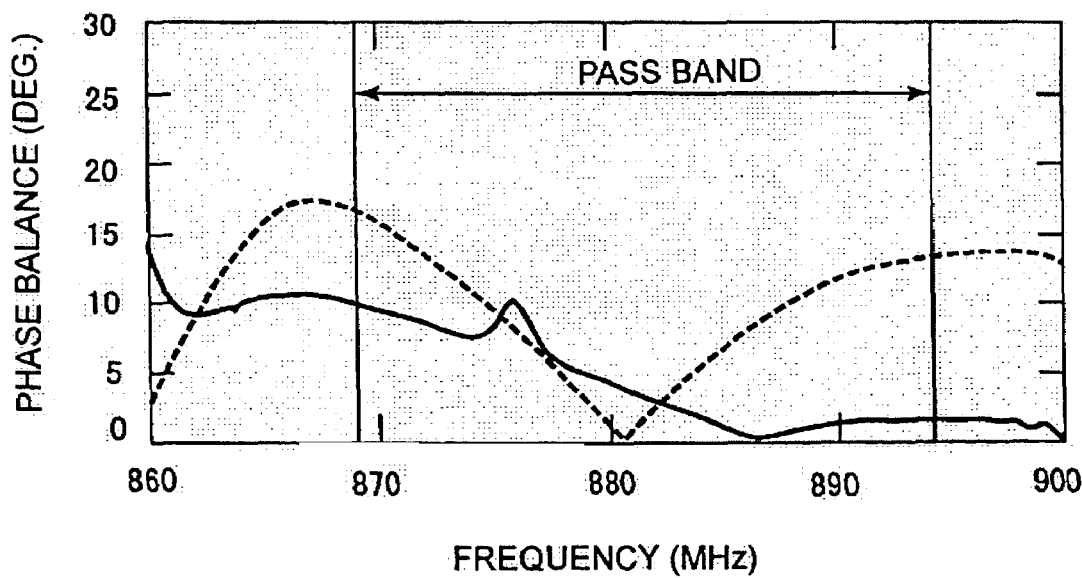
FIG. 19 shows a graph illustrating the relationship between phase balance and frequency characteristics of each of the third preferred embodiment of the present invention and the conventional device.

In FIG. 18, a solid line shows the relationship between amplitude balance and frequency characteristics of the longitudinally coupled resonator type surface acoustic wave filter of the fourth preferred embodiment. In FIG. 19, a solid line shows the relationship between phase balance and frequency characteristics of the surface acoustic wave filter. For comparison, broken lines show the result of the conventional filter shown in FIG. 15.

As found in FIG. 19, the maximum amplitude balance in a pass band in the AMPS reception filter is 1.9 dB in the conventional filter, whereas it is about 1.2 dB in the fourth preferred embodiment of the present invention. Thus, the amplitude balance is improved by about 0.7 dB. Additionally, as shown in FIG. 19, whereas the maximum phase balance is 17° in the conventional filter, it is about 11° in the fourth preferred embodiment. Thus, the phase balance is improved by about 6° in the fourth preferred embodiment.

In other words, in the fourth preferred embodiment, the first-stage and first-stage longitudinally coupled resonator type surface acoustic wave filters having three IDTs are longitudinally connected to each other. In addition, the polarities of the electrode fingers of the first and third IDTs adjacent to the central second IDT are opposite to each other. With this arrangement, the amplitude balance and the phase balance are greatly improved.

Figure 20:
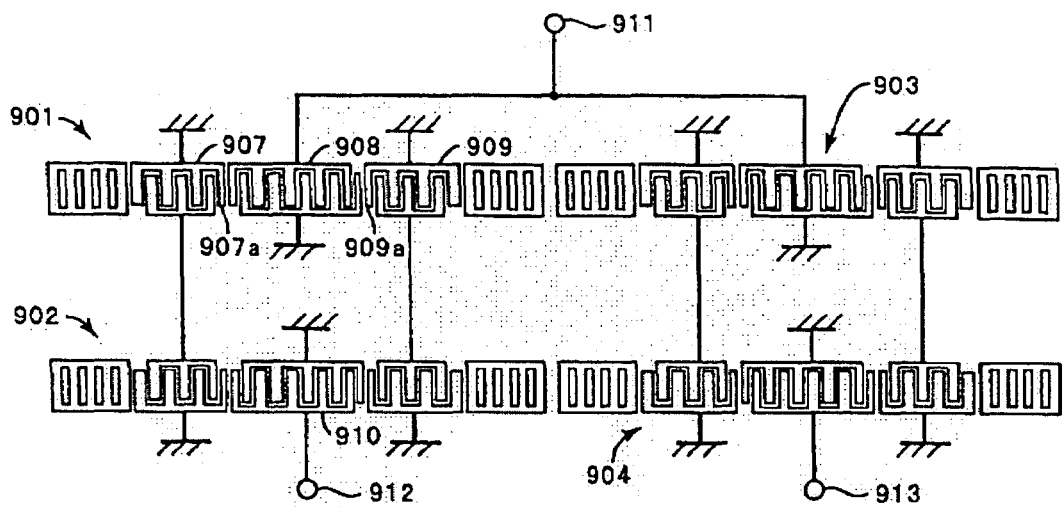
FIG. 20 shows a schematic plan view for illustrating a longitudinally coupled resonator type surface acoustic wave filter according to a fourth preferred embodiment of the present invention.

FIG. 20 shows a schematic plan view for illustrating the electrode structure of the longitudinally coupled resonator type surface acoustic wave filter according to a fifth preferred embodiment of the present invention. The fifth preferred embodiment uses 3-IDT-type longitudinally coupled resonator type surface acoustic wave filters 901, 902, 903 and 904 having first, second and third IDTs. In each of the longitudinally coupled resonator type surface acoustic wave filters 901, 902, 903 and 904, the central second IDT has even electrode fingers, and the polarities of the electrode fingers of the right and left IDTs adjacent to the central second IDT are the same. For example, in the longitudinally coupled resonator type surface acoustic wave filter 901, the electrode finger 907a of the first IDT 907 and the electrode finger 909a of the third IDT 909 adjacent to the second IDT 908 have the same polarity.

Although the longitudinally coupled resonator type surface acoustic wave filters 901, 902 and 903 preferably have the same structure, only the longitudinally coupled resonator type surface acoustic wave filter 902 has the second IDT 910 reversed.

The reference numeral 911 denotes an unbalanced signal terminal and the reference numerals 912 and 913 denote balanced signal terminals.

In each of the first, second, third and fourth longitudinally coupled resonator type surface acoustic wave filters 901, 902, 903 and 904, the first IDT is 180° out of phase with the third IDT. For example, in the longitudinally coupled resonator type surface acoustic wave filter 901, the first IDT 907 is 180° out of phase with the third IDT 909.

In the fifth preferred embodiment, similar to the second, third and fourth preferred embodiments, the amplitude balance and the phase balance in the filter are greatly improved. Moreover, in the fifth preferred embodiment, output impedance substantially quadruples.

Figure 21:
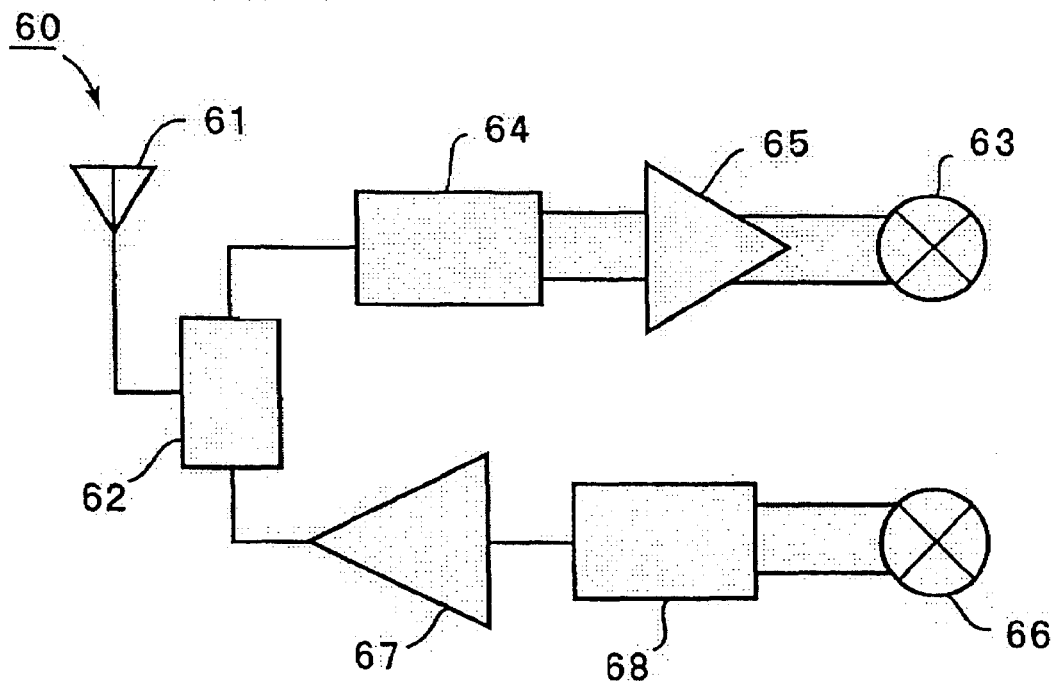
FIG. 21 shows a schematic block diagram for illustrating a communication apparatus as an example of an apparatus including the longitudinally coupled resonator type surface acoustic wave filter according to preferred embodiments of the present invention.

FIGS. 21 shows a schematic plan view for illustrating a communication apparatus 60 incorporating the longitudinally coupled resonator type surface acoustic wave filter according to other preferred embodiments of the present invention.

In FIG. 21, an antenna 61 is connected to a duplexer 62. A surface acoustic wave filter 64 and an amplifier 65 are connected between the duplexer 62 and a mixer 63 of the reception section. An amplifier 67 and a surface acoustic wave filter 68 are connected between the duplexer 62 and a mixer 66 of the transmission section. As shown here, when the amplifier 65 is adapted to a balanced signal, the longitudinally coupled resonator type surface acoustic wave filter of various preferred embodiments of the present invention can be suitably used as the surface acoustic wave filter 64.

As described above, in the longitudinally coupled resonator type surface acoustic wave filter according to various preferred embodiments of the present invention, the central second IDT preferably has an even number of electrode fingers. In addition, the polarities of electrode fingers adjacent to the second IDT in the first and third IDTs disposed on the right-and-left sides of the second IDT are opposite. Thus, the amplitude balance and the phase balance between the balanced signal terminals are greatly effectively improved. As a result, preferred embodiments of the present invention provide a surface acoustic wave filter having an excellent balance-unbalance conversion function.

Furthermore, in the longitudinally coupled resonator type surface acoustic wave filter according to other preferred embodiments of the present invention, first-stage and second-stage longitudinally coupled resonator type surface acoustic wave filters having first, second and third IDTs are longitudinally connected to each other. One end of the second IDT of the first-stage longitudinally coupled resonator type surface acoustic wave filter is connected to an unbalanced signal terminal. Additionally, both ends of the second IDT of the second-stage longitudinally coupled resonator type surface acoustic wave filter are connected to a pair of balanced signal terminals. In this arrangement, an electric signal propagating through a first signal line connecting one end of the first IDT of the first-stage longitudinally coupled resonator type surface acoustic wave filter and one end of the first IDT of the second-stage longitudinally coupled resonator type surface acoustic wave filter is 180° out of phase with an electric signal propagating through a second signal line connecting one end of the third IDT of the first-stage longitudinally coupled resonator type surface acoustic wave filter and one end of the third IDT of the second-stage longitudinally coupled resonator type surface acoustic wave filter. As a result, the polarity of the electrode finger of the second IDT adjacent to each of the first and third IDTs can be the same as the polarity of the electrode finger of each of the first and third IDTs adjacent to the second IDT. Thus, the amplitude balance and the phase balance in the filter are effectively improved.

According to this preferred embodiment of the present invention, in at least one of the first-stage and second-stage longitudinally coupled resonator type surface acoustic wave filters, when the second IDT has an even number of electrode fingers, the amplitude balance and the phase balance are improved even more.

In various preferred embodiments of the present invention, the longitudinally coupled resonator type surface acoustic wave filter has the above-described balance-unbalance conversion function and the balance between the pair of balanced signal terminals is greatly improved. Accordingly, when producing a communication apparatus incorporating the longitudinally coupled resonator type surface acoustic wave filter, the characteristics of the communication apparatus can be greatly improved while reducing the size of the apparatus.

While the present invention has been described with reference to what are at present considered to be preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A longitudinally coupled resonator type surface acoustic wave filter having a balance-unbalance conversion function, the filter comprising:
    first-stage and second-stage longitudinally coupled resonator type surface acoustic wave filters longitudinally coupled to each other, each of the first-stage longitudinally coupled resonator type surface acoustic wave filter and the second-stage longitudinally coupled resonator type surface acoustic wave filter includes a piezoelectric substrate and first, second and third IDTs arranged on the piezoelectric substrate in a surface acoustic wave propagating direction, the second IDT of at least one of the first-stage and the second-stage longitudinally coupled resonator type surface acoustic wave filters is split into first and second parts;
    an unbalanced signal terminal connected to the second IDT of the first-stage longitudinally coupled resonator type surface acoustic wave filter;
    a first and a second balanced signal terminal connected to the second IDT of the second-stage longitudinally coupled resonator type surface acoustic wave filter;
    a first signal line connecting one end of the first IDT of the first-stage longitudinally coupled resonator type surface acoustic wave filter and one end of the first IDT of the second-stage longitudinally coupled resonator type surface acoustic wave filter; and
    a second signal line connecting one end of the third IDT of the first-stage longitudinally coupled resonator type surface acoustic wave filter and one end of the third IDT of the second-stage longitudinally coupled resonator type surface acoustic wave filter; wherein
    an electric signal propagating through the first signal line is 180° out of phase with an electric signal propagating through the second signal line; and
    in the second-stage longitudinally coupled resonator type surface acoustic wave filter, electrode fingers of the second IDT adjacent to the first and third IDTs have the same polarities, and electrode fingers of the first and third IDTs adjacent to the second IDT have the same polarities.

2. A longitudinally coupled resonator type surface acoustic wave filter according to claim 1, wherein the piezoelectric substrate of each of the first-stage and second-stage longitudinally coupled resonator type surface acoustic wave filters is made of one of LiTaO$_3$ and LiNbO$_3$.

3. A longitudinally coupled resonator type surface acoustic wave filter according to claim 1, wherein each of the first-stage and second-stage longitudinally coupled resonator type surface acoustic wave filters further comprises reflectors arranged in the surface wave propagating direction on the right and left of the region where the first, second and third IDTs are arranged.

4. A longitudinally coupled resonator type surface acoustic wave filter according to claim 1, wherein in each of the first-stage and second-stage longitudinally coupled resonator type surface acoustic wave filters, widths of the electrode fingers on each side of the second IDT are different from the remaining electrode fingers.

5. A longitudinally coupled resonator type surface acoustic wave filter according to claim 1, wherein in the first-stage longitudinally coupled resonator type surface acoustic wave filters, electrode fingers of said first and third IDTs adjacent to the second IDT have the same polarities.

6. A longitudinally coupled resonator type surface acoustic wave filter according to claim 1, wherein in each of the first-stage and second-stage longitudinally coupled resonator type surface acoustic wave filters, each of the first, second and third IDTs Include narrow pitch electrode finger sections that are relatively narrower than others of the electrode finger sections included in the first, second and third IDTs.

7. A longitudinally coupled resonator type surface acoustic wave filter according to claim 1, wherein in each of the first-stage and second-stage longitudinally coupled resonator type surface acoustic wave filters, the finger electrodes of the first and third IDTs that are adjacent to the central second IDT are electrically connected to each other.

8. A longitudinally coupled resonator type surface acoustic wave filter according to claim 1, wherein in the second-stage longitudinally coupled resonator type surface acoustic wave filter, the polarities of the electrode fingers of the second IDT adjacent to the first and third IDTs are the same as the polarities of electrode fingers of the first and third IDTs adjacent to the second IDT.

9. A longitudinally coupled resonator type surface acoustic wave filter according to claim 1, wherein in the first-stage longitudinally coupled resonator type surface acoustic wave filter, the polarity of one of the electrode fingers of the second IDT adjacent to the first and third IDTs is the same as the polarity of one of electrode fingers of the first and third IDTs adjacent to the second IDT.

10. A longitudinally coupled resonator type surface acoustic wave filter according to claim 1, wherein the second IDT of the second-stage longitudinally coupled resonator type surface acoustic wave filters is split into first and second parts;
    the first balanced signal terminal is connected to the first part of the second IDT of the second-stage longitudinally coupled resonator type surface acoustic wave filter; and
    the second balanced signal terminal is connected to the second part of the second IDT of the second-stage longitudinally coupled resonator type surface acoustic wave filter.

11. A communication apparatus comprising the longitudinally coupled resonator type surface acoustic wave filter according to claim 1.

12. A longitudinally coupled resonator type surface acoustic wave filter having a balance-unbalance conversion function, the filter comprising:
    first-stage and second-stage longitudinally coupled resonator type surface acoustic wave filters longitudinally coupled to each other, each of the first-stage longitudinally coupled resonator type surface acoustic wave filter and the second-stage longitudinally coupled resonator type surface acoustic wave filter including a piezoelectric substrate and first, second and third IDTs arranged on the piezoelectric substrate in a surface acoustic wave propagating direction, the second IDT of at least one of the first-stage and the second-stage longitudinally coupled resonator type surface acoustic wave filters is split into first and second parts;

an unbalanced signal terminal connected to one end of the second IDT of the first-stage longitudinally coupled resonator type surface acoustic wave filter;

a first balanced signal terminal connected to one end of the second IDT of the second-stage longitudinally coupled resonator type surface acoustic wave filter;

a second balanced signal terminal connected to said one end of the second IDT of the second-stage longitudinally coupled resonator type surface acoustic wave filter;

a first signal line connecting one end of the first IDT of the first-stage longitudinally coupled resonator type surface acoustic wave filter and one end of the first IDT of the second-stage longitudinally coupled resonator type surface acoustic wave filter; and a second signal line connecting one end of the third IDT of the first-stage longitudinally coupled resonator type surface acoustic wave filter and one end of the third IDT of the second-stage longitudinally coupled resonator type surface acoustic wave filter;

wherein an electric signal propagating through the first signal line is 180° out of phase with an electric signal propagating through the second signal line; and in the second-stage longitudinally coupled resonator type surface acoustic wave filter, electrode fingers of the second IDT adjacent to the first and third IDTs have the same polarities, and electrode fingers of the first and third IDTs adjacent to the second IDT have the same polarities.

13. A longitudinally coupled resonator type surface acoustic wave filter according to claim 12, wherein the second IDT of at least one of the first-stage longitudinally coupled resonator type surface acoustic wave filter and the second-stage longitudinally coupled resonator type surface acoustic wave filter has an even number of electrode fingers.

14. A longitudinally coupled resonator type surface acoustic wave filter according to claim 12, wherein the piezoelectric substrate of each of the first-stage and second-stage longitudinally coupled resonator type surface acoustic wave filters is made of one of $LiTaO_3$ and $LiNbO_3$.

15. A longitudinally coupled resonator type surface acoustic wave filter according to claim 12, wherein each of first-stage and second-stage longitudinally coupled resonator type surface acoustic wave filters further comprises reflectors arranged in the surface wave propagating direction on the right and left of the region where the first, second and third IDTs are arranged.

16. A longitudinally coupled resonator type surface acoustic wave filter according to claim 12, wherein in each of the first-stage and second-stage longitudinally coupled resonator type surface acoustic wave filters, widths of the electrode fingers on each side of the second IDT are smaller than those of the remaining electrode fingers.

17. A longitudinally coupled resonator type surface acoustic wave filter according to claim 12, wherein the first-stage longitudinally coupled resonator type surface acoustic wave filters, the electrode fingers adjacent to the second IDT have the same polarities.

18. A longitudinally coupled resonator type surface acoustic wave filter according to claim 12, wherein in each of the first-stage and second-stage longitudinally coupled resonator type surface acoustic wave filters, each of the first, second and third IDTs include narrow pitch electrode finger sections that are relatively narrower than others of the electrode finger sections included in the first, second and third IDTs.

19. A longitudinally coupled resonator type surface acoustic wave filter according to claim 12, wherein in each of the first-stage and second-stage longitudinally coupled resonator type surface acoustic wave filters, the finger electrodes of the first and third IDTs that are adjacent to the second IDT are arranged to define signal electrodes.

20. A longitudinally coupled resonator type surface acoustic wave filter according to claim 12, wherein in the second-stage longitudinally coupled resonator type surface acoustic wave filters, the second IDT is split into two parts.

21. A communication apparatus comprising the longitudinally coupled resonator type surface acoustic wave filter according to claim 12.

* * * * *